US012765071B2

(12) United States Patent
Chang et al.

(10) Patent No.: US 12,765,071 B2
(45) Date of Patent: Oct. 13, 2026

(54) ELECTROSTATIC DISCHARGE PROTECTION DEVICE AND METHOD OF FABRICATING THE SAME

(71) Applicant: United Microelectronics Corp., Hsinchu (TW)

(72) Inventors: Chih Hsiang Chang, Tainan City (TW); Mei-Ling Chao, Tainan City (TW); Yin-Chia Tsai, Tainan City (TW); Tien-Hao Tang, Hsinchu City (TW); Kuan-Cheng Su, Taipei (TW)

(73) Assignee: United Microelectronics Corp., Hsinchu (TW)

(*) Notice: Subject to any disclaimer, the term of this patent is extended or adjusted under 35 U.S.C. 154(b) by 814 days.

(21) Appl. No.: 18/164,622

(22) Filed: Feb. 6, 2023

(65) Prior Publication Data

US 2024/0162218 A1 May 16, 2024

(30) Foreign Application Priority Data

Nov. 11, 2022 (CN) ......................... 202211413980.9

(51) Int. Cl.
*H10W 42/00* (2026.01)
*H10D 86/01* (2025.01)
*H10D 89/60* (2025.01)

(52) U.S. Cl.
CPC ........... *H10D 89/611* (2025.01); *H10D 86/01* (2025.01); *H10D 89/711* (2025.01); *H10D 89/811* (2025.01); *H10D 89/921* (2025.01); *H10D 89/931* (2025.01)

(58) Field of Classification Search
CPC .. H10B 12/482; H10B 12/315; H10B 12/485; H10B 12/488; H10B 12/50; H10B 12/00; H10B 12/0335; H10B 12/34; H10B 12/48; H10B 12/05; H10W 20/435; H01L 23/5283
See application file for complete search history.

(56) References Cited

U.S. PATENT DOCUMENTS

| | | | | | |
|---|---|---|---|---|---|
| 5,874,763 | A * | 2/1999 | Ham | H10D 89/811 | 257/355 |
| 9,899,369 | B2 | 2/2018 | Tseng et al. | | |
| 10,297,590 | B1 * | 5/2019 | Laine | H10D 89/814 | |
| 2002/0074602 | A1 * | 6/2002 | Lin | H10D 89/711 | 257/355 |
| 2003/0202307 | A1 * | 10/2003 | Hung | H10D 89/815 | 361/100 |
| 2004/0141266 | A1 * | 7/2004 | Ker | H10D 89/811 | 361/56 |

(Continued)

*Primary Examiner* — Samuel Park
(74) *Attorney, Agent, or Firm* — JCIPRNET

(57) ABSTRACT

An electrostatic discharge device including a gate structure, a plurality of first doped regions, and a plurality of second doped regions. The gate structure is disposed on a substrate. The gate structure includes a body part and a plurality of extension parts. The extension parts are connected with the body part, and an extension direction of the body part is different from an extension direction of the extension parts. The first doped regions are located in the substrate between the extension parts. The second doped regions are located in the substrate at two outer sides of the extension parts. The first doped regions and the second doped regions have different conductivity types.

17 Claims, 14 Drawing Sheets

(56) References Cited

U.S. PATENT DOCUMENTS

| | | | | |
|---|---|---|---|---|
| 2007/0002507 | A1* | 1/2007 | O | H10D 89/819<br>361/56 |
| 2012/0326235 | A1* | 12/2012 | Otsuru | H10D 89/10<br>257/355 |
| 2017/0221878 | A1* | 8/2017 | Risaki | H10D 89/814 |

* cited by examiner

ELECTROSTATIC DISCHARGE PROTECTION DEVICE AND METHOD OF FABRICATING THE SAME

CROSS-REFERENCE TO RELATED APPLICATION

This application claims the priority benefit of China application serial no. 202211413980.9, filed on Nov. 11, 2022. The entirety of the above-mentioned patent application is hereby incorporated by reference herein and made a part of this specification.

BACKGROUND

Technical Field

The present disclosure relates to a semiconductor device and a method of fabricating the same, and particularly relates to an electrostatic discharge protection device and a method of fabricating the same.

Description of Related Art

Electrostatic discharge (ESD) is a phenomenon in which charges accumulate on a non-conductor or an ungrounded conductor and move (discharge) rapidly in a short period of time through a discharge path. Electrostatic discharge may damage circuits composed of integrated circuit devices. For example, a human body, a machine for packaging integrated circuits, or an instrument for testing integrated circuits are common charged objects. When these charged objects come into contact with the chip, they may discharge to the chip. The instantaneous power of electrostatic discharge may cause damage or failure of the integrated circuit in the chip.

Generally, the electrostatic discharge tolerance of commercial integrated circuits must pass the positive human body model (HBM) test, the negative human body model (−HBM) test and the machine model (MM) test. In order to be able to withstand high-voltage ESD tests, electrostatic discharge protection devices on integrated circuits often have a design with a large device size, thus occupying a relatively large chip area.

SUMMARY

The present disclosure provides an electrostatic discharge protection device, which can withstand high-voltage electrostatic discharge tests and can save chip area.

The present disclosure further provides a method of fabricating an electrostatic discharge protection device, which can save chip area and can be integrated with the existing fabricating processes.

According to an embodiment of the present disclosure, an electrostatic discharge protection device includes a gate structure, a plurality of first doped regions, and a plurality of second doped regions. The gate structure is disposed on a substrate. The gate structure includes a body part and a plurality of extension parts. The extension parts are connected with the body part, and an extension direction of the body part is different from an extension direction of the extension parts. The first doped regions are located in the substrate between the extension parts. The second doped regions are located in the substrate at two outer sides of the extension parts. The first doped regions and the second doped regions have different conductivity types.

According to an embodiment of the present disclosure, a method of fabricating an electrostatic discharge protection device includes following steps. A gate structure is formed on the substrate, wherein the gate structure includes a body part and a plurality of extension parts, an extending direction of the body part is different from an extension direction of the plurality of extension parts, and the body part is connected to the plurality of extension parts. A plurality of first doped regions is formed in the substrate between the plurality of extension parts. A plurality of second doped regions is formed in the substrate at two outer sides of the plurality of extension parts. The plurality of first doped regions and the plurality of second doped regions have different conductivity types.

In view of the above, the embodiment of the present disclosure provides an electrostatic discharge protection device having at least one embedded diode, so as to enhance the negative human body discharge mode and therefore withstand the high-voltage ESD test. Besides, such diode is embedded and in direct contact with the transistor, so the chip area can be saved. The manufacturing method of the present disclosure can be integrated with the existing manufacturing process.

In order to make the above and other features and advantages of the disclosure more evident and easier to understand, the following embodiments are provided and represented in detail with the accompanying drawings as follows.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DESCRIPTION OF THE EMBODIMENTS

Figure 1A:
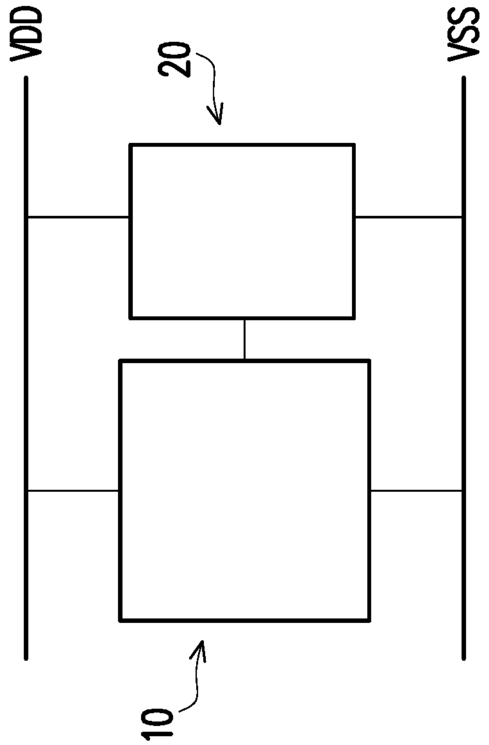
FIG. 1A is a block diagram of an integrated circuit according to an embodiment of the present disclosure.

Referring to FIG. 1A, an integrated circuit according to an embodiment of the present disclosure includes an ESD-transient detection circuit 10, and an electrostatic discharge protection device 20 connected to the ESD-transient detection circuit 10. The ESD-transient detection circuit 10 and the electrostatic discharge protection device 20 are respectively connected to the drain power supply voltage VDD and the source power supply voltage VSS. In some embodiments of the present disclosure, the electrostatic discharge protection device 20 includes a metal oxide semiconductor (MOS) transistor and an embedded diode. The embedded diode can be a gated diode or a non-gated diode. In some embodiments, the MOS transistor can be an N-type MOS transistor, and the gated diode can be an embedded N-gated diode or a non-gated diode. In some embodiments of the present disclosure, the metal oxide semiconductor transistor and the embedded diode can directly contact or share an element (such as doped region), so as to save chip area.

Figure 1B:
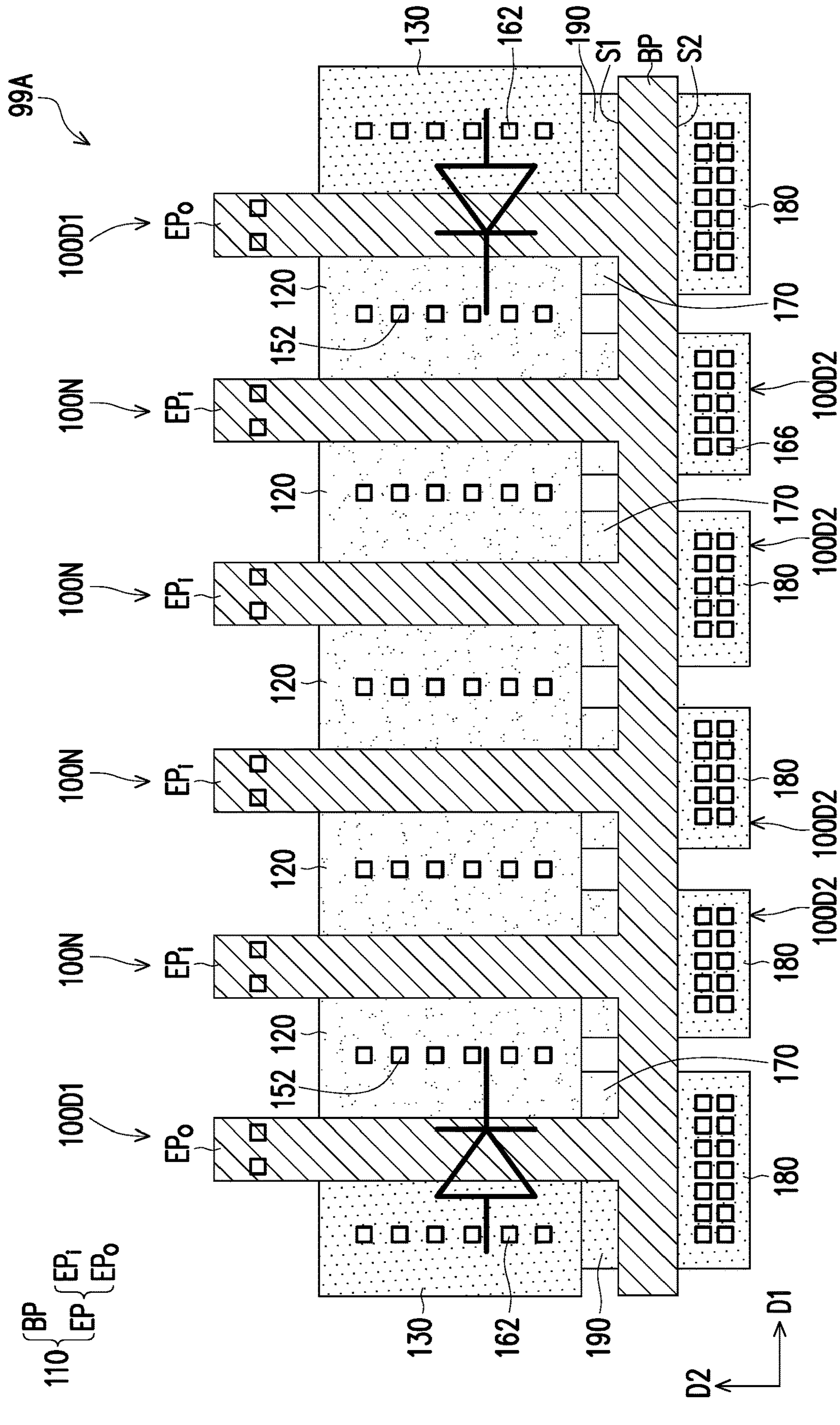
FIG. 1B is a top view of an electrostatic discharge protection device according to an embodiment of the present disclosure.
Figure 1C:
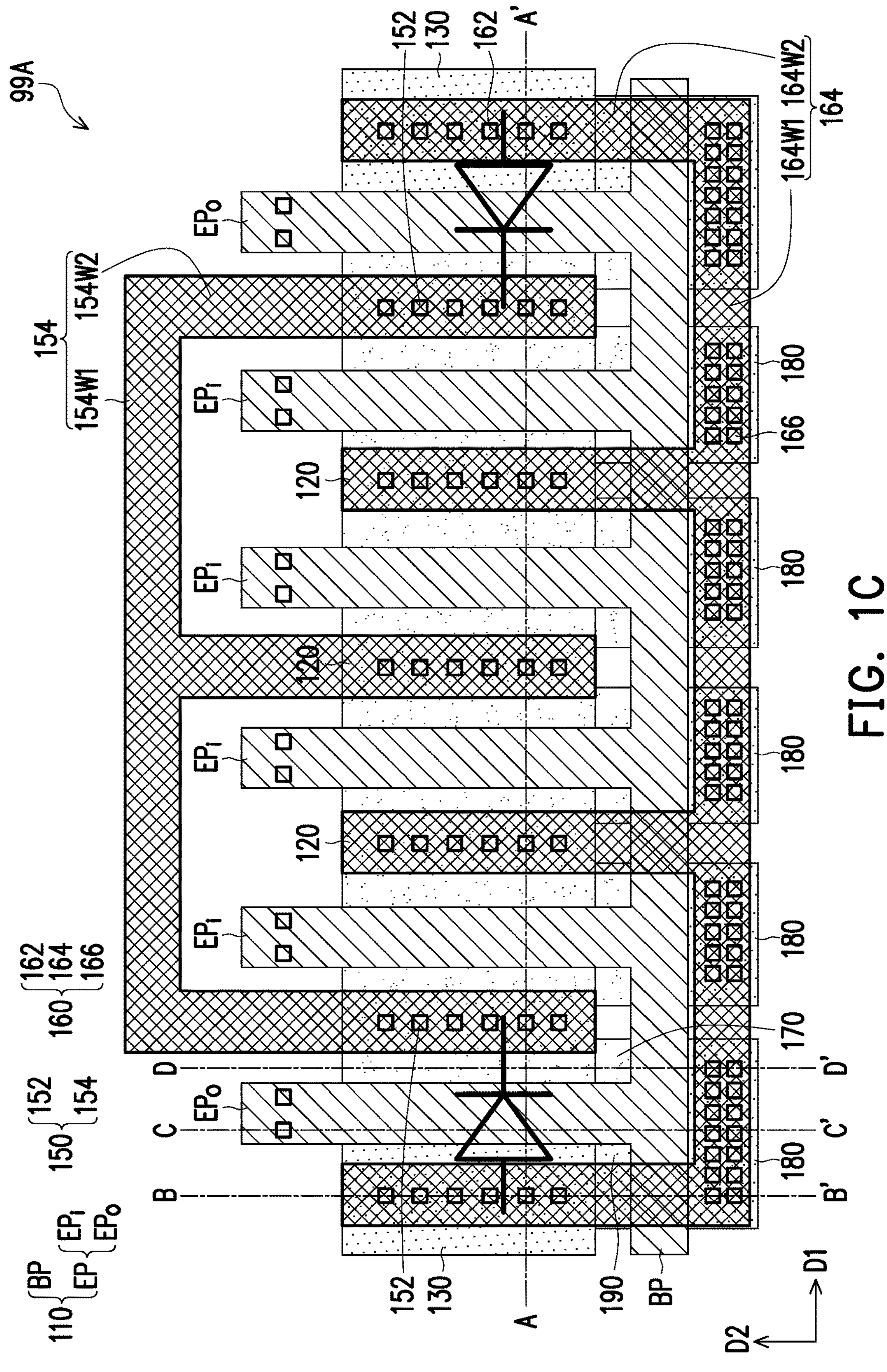
FIG. 1C is a top view of an electrostatic discharge protection device having metal interconnections according to an embodiment of the present disclosure.

FIG. 1B is a top view of an electrostatic discharge protection device according to an embodiment of the present disclosure. FIG. 1C is a top view of an electrostatic discharge protection device having metal interconnections according to an embodiment of the present disclosure. FIG. 2A to FIG. 2D are schematic cross-sectional views taken along lines A-A', B-B', C-C' and D-D' in FIG. 1C, respectively.

Figure 2A:
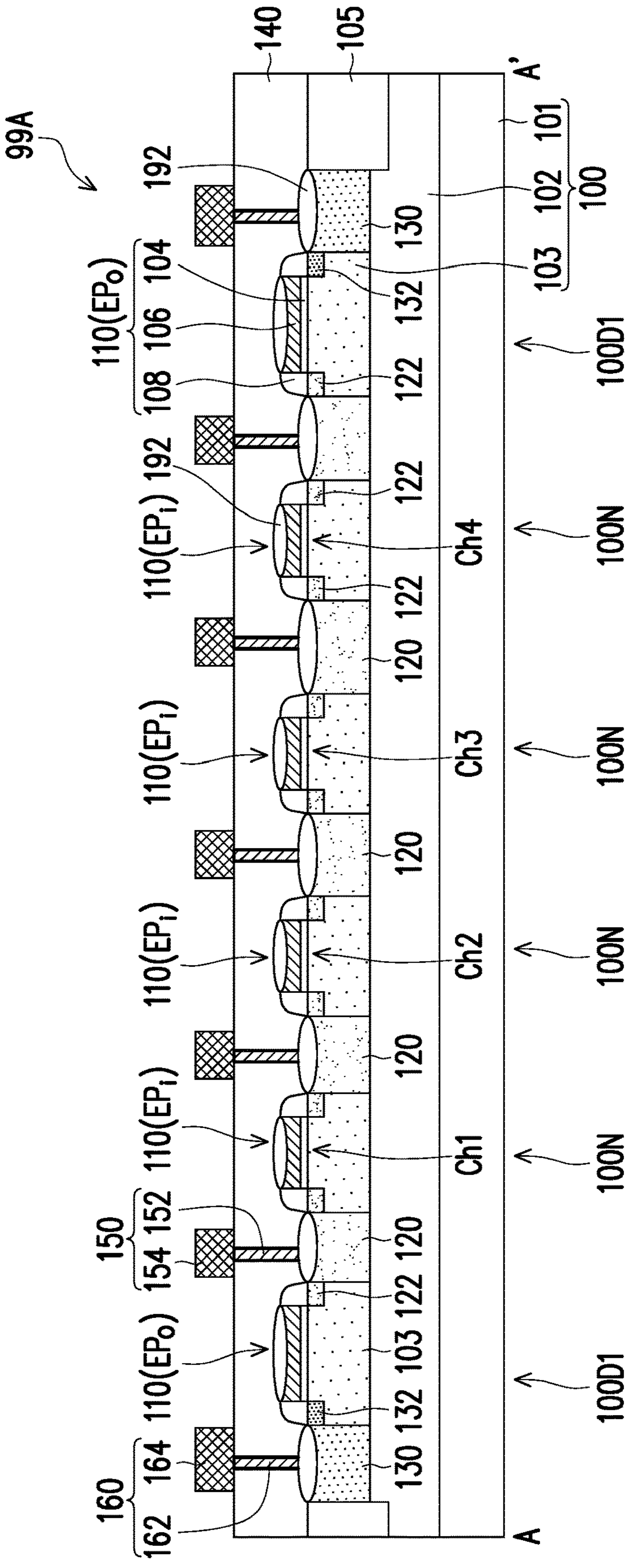
FIG. 2A to FIG. 2D are schematic cross-sectional views taken along lines A-A', B-B', C-C' and D-D' in FIG. 1C, respectively.

Referring to FIG. 1B and FIG. 2A, an electrostatic discharge protection device 99A includes a plurality of bipolar junction transistors (BJTs) 100N, and a plurality of embedded gated diodes 100D1 connected to the bipolar junction transistor transistors 100N, which are described in details below. The electrostatic discharge protection device 99A includes a gate structure 110, a plurality of first doped regions 120 and a plurality of second doped regions 130. The gate structure 110 is disposed on the substrate 100. The gate structure 110 may be comb-shaped or finger-shaped. In some embodiments, the gate structure 110 includes a body part BP and a plurality of extension parts EP. The body part BP and the plurality of extension parts EP are elongated, for example. The extension direction of the body part BP is different from the extension direction of the extension parts EP. For example, the body part BP extends along the first direction D1. The extension parts EP extend along the second direction D2 different from the first direction D1, and are arranged in parallel to each other along the first direction D1. The extension parts EP are disposed at the same side S1 of the body part BP, and are connected to the body part BP. The distances between the extension parts EP may be the same or different. The extension parts EP may include two outer extension parts EPo and multiple inner extension parts EPi between the outer extension parts EPo. In FIG. 1B, FIG. 1C and FIG. 2A, a single body part BP and six extension parts EP are shown, but the present disclosure is not limited thereto. Each gate structure 110 may include a body part BP and more or less extension parts EP.

Referring to FIG. 1B and FIG. 2A, the first doped regions 120 and the second doped regions 130 of the electrostatic discharge protection device 99A have different conductivity types. For example, the first doped regions 120 have dopants of a first conductivity type, and the second doped regions 130 have dopants of a second conductivity type different from the first conductivity type. The first doped regions 120 are formed between the extension parts EP. That is, two first doped regions 120 are disposed at two sides of each inner extension parts EPi. The second doped regions 130 are formed outside of the two outer extension parts EPo. Each of the first doped regions 120 and the second doped regions 130 extend along the second direction D2.

Referring to FIG. 2A, the first doped regions 120 and the second doped regions 130 are formed in the semiconductive layer 103 of the substrate 100. Bottom surfaces of the first doped regions 120 are in contact with the top surface of the buried insulating layer 102 of the substrate 100. The bottom surface of each second doped region 130 is in contact with the top surface of the buried insulating layer 102 of the substrate 100. Each second doped region 130 has a sidewall in contact with the semiconductive layer 103, and another sidewall in contact with the isolation structure 105 formed in the substrate 100.

Referring to FIG. 1C and FIG. 2A, in some examples, the electrostatic discharge protection device 99A further includes an interlayer dielectric (ILD) layer 140, a first metal interconnection 150 and a second metal interconnection 160. The first metal interconnection 150 extends into the interlayer dielectric layer 140 and is electrically connected to the first portions (e.g., odd number) of the first doped regions 120. The second metal interconnection 160 extends into the interlayer dielectric layer 140 and is electrically connected to the second portions (e.g., even number) of the first doped region 120 and the second doped regions 130.

Referring to FIG. 1C and FIG. 2A, the first metal interconnection 150 may include contacts 152 and conductive wires 154 electrically connected to the contacts 152. The second metal interconnection 160 may include contacts 162 and conductive wires 164 electrically connected to the contacts 162. The contacts 152 and 162 extend through the interlayer dielectric layer 140. The conductive wires 154 and the conductive wires 164 are disposed on the interlayer dielectric layer 140. The conductive wires 154 are electrically connected to the first portions (e.g., odd number) of the first doped regions 120 of through the contacts 152. The conductive wires 164 are electrically connected to the second portions (e.g., even number) of the first doped regions 120 and the second doped regions 130 of through the contacts 162.

Referring to FIG. 1C and FIG. 2A, the conductive wires 154 and 164 may be respectively comb-shaped or finger-shaped, but the present disclosure is not limited thereto. The conductive wires 154 and the conductive wires 164 may be opposite to each other and some parts thereof are arranged alternately with each other along the first direction D1. For example, the conductive wire 154 may include a first wiring part 154W1 and a plurality of second wiring parts 154W2 connected to the first wiring part 154W1. The conductive wire 164 may include a first wiring part 164W1 and a plurality of second wiring parts 164W2 connected to the first wiring part 164W1. The first wiring part 154W1 and the first wiring part 164W1 extend along the first direction D1 and are arranged in parallel to each other. The second wiring parts 154W2 and the second wiring parts 164W2 extend along the second direction D2, and are parallel to each other and alternately arranged along the first direction D1.

Referring to FIG. 1B, the electrostatic discharge protection device 99A further includes a plurality of third doped regions 170, a plurality of fourth doped regions 180 and a plurality of fifth doped regions 190. The third doped regions 170 and the first doped regions 120 have the same conductivity type, for example, dopants of the first conductivity type. The fifth doped regions 190, the fourth doped regions 180 and the second doped regions 130 have the same conductivity type, for example, dopants of the second conductivity type. The dopant of the first conductivity type is an N-type dopant, for example. The N-type dopant is phosphorus or arsenic, for example. The dopant of the second conductivity type is a P-type dopant, for example. The P-type dopant is boron or boron trifluoride, for example.

Figure 2C:
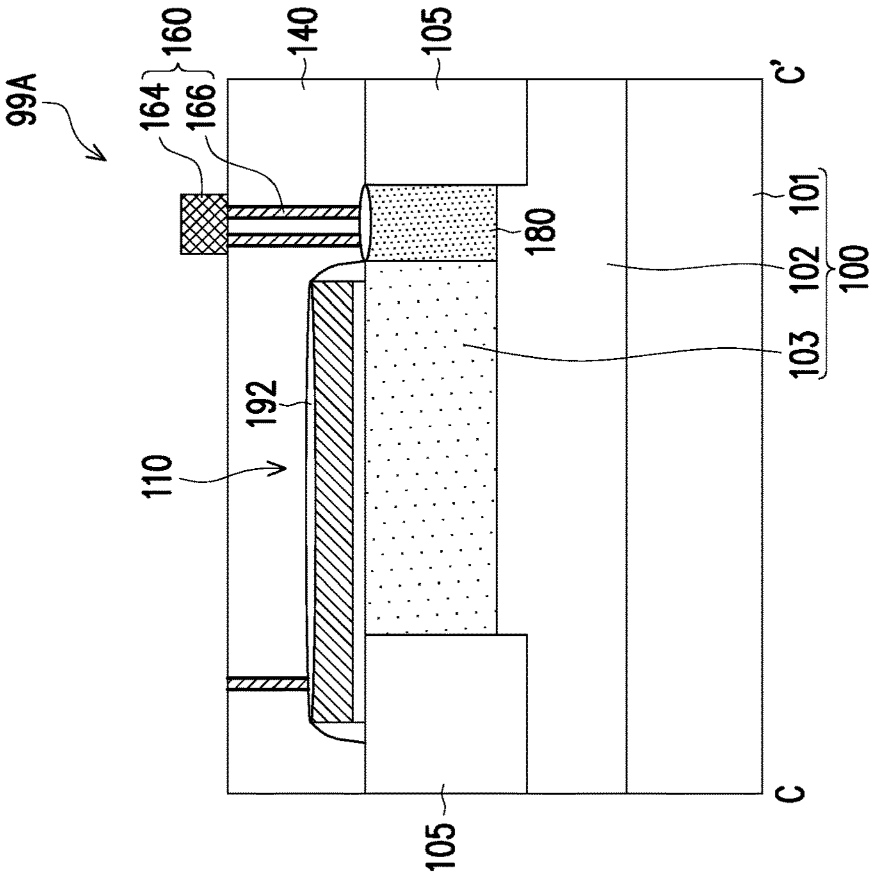
Figure 2B:
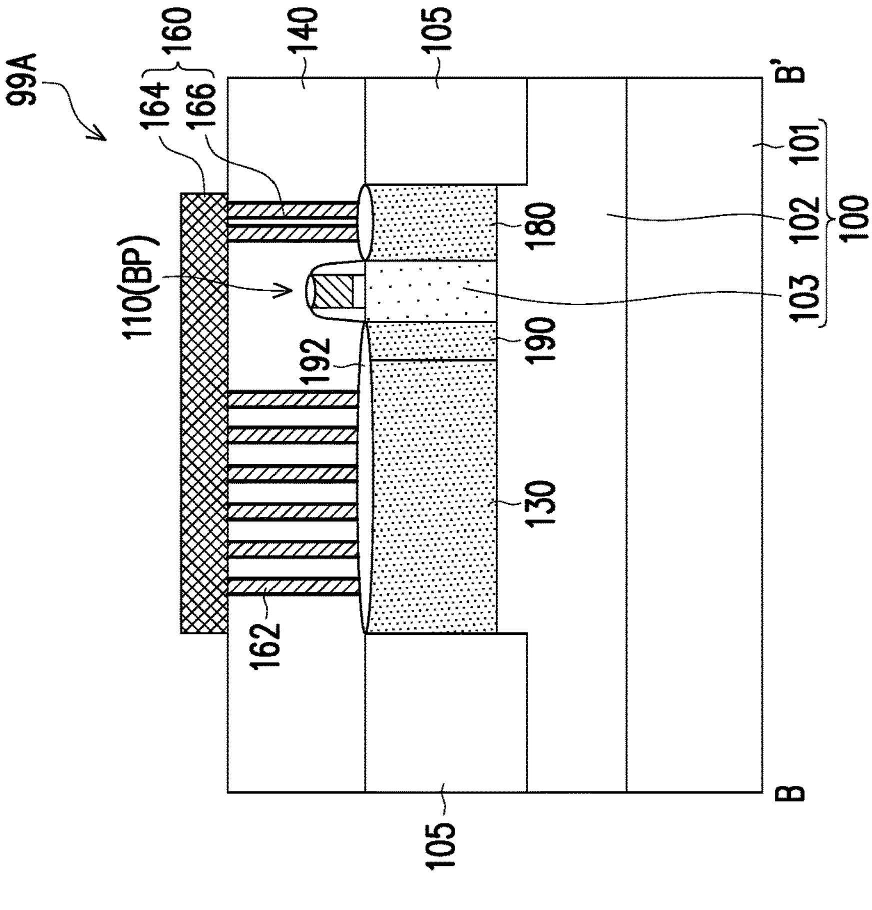
Figure 2D:
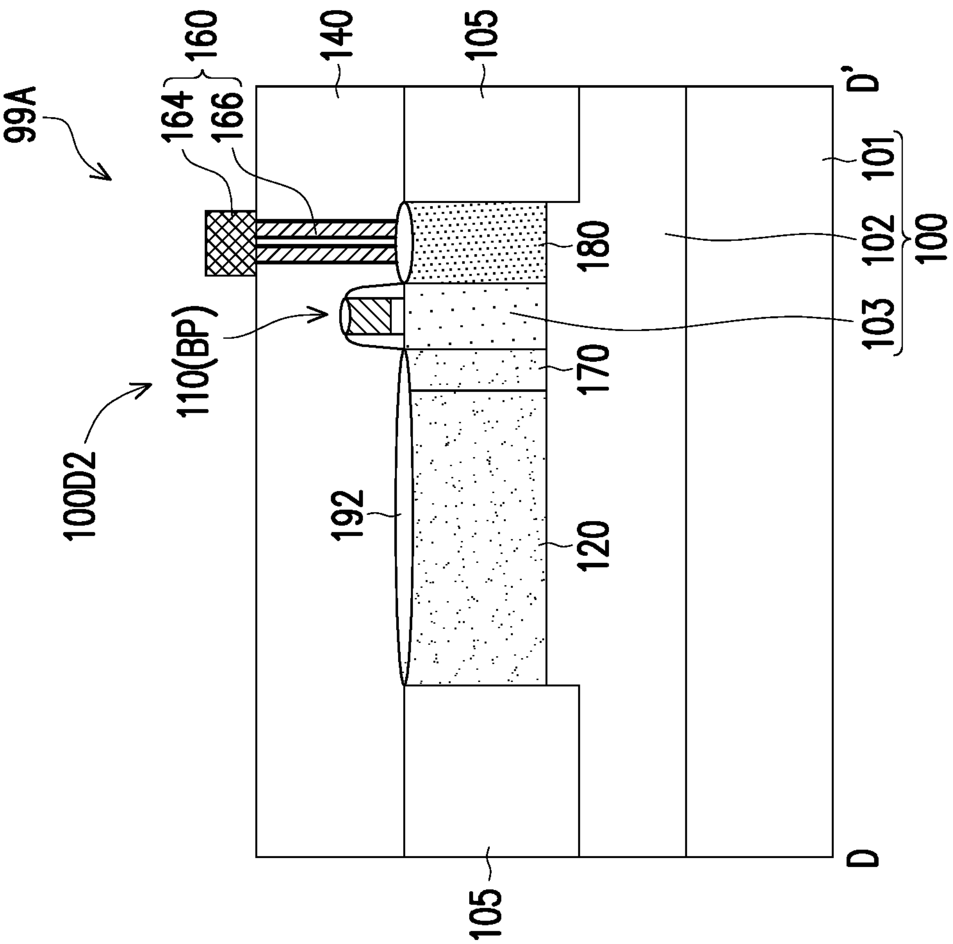

Referring to FIG. 1B, the third doped regions 170 are located at the first side S1 of the body part BP, as shown in FIG. 1B. Referring to FIG. 2D, the third doped regions 170 are formed between the extension parts EP. That is, the third doped regions 170 are formed at two sides of each inner extension part EPi and between the inner extension part EPi and the outer extension part EPo adjacent to each other. Each third doped region 170 is formed in the semiconductive layer 103 and is in physical contact to and laterally connected to the adjacent first doped region 120.

Referring to FIG. 1B, the fourth doped regions 180 are located at the second side S2 of the body part BP. Referring to FIG. 2B and FIG. 2C, the fourth doped regions 180 are in the semiconductive layer 103, and a sidewall of one fourth doped regions 180 is in contact with the semiconductive layer 103, another sidewall of the fourth doped region 180 is in contact with the isolation structure 105, and the bottom surface of the fourth doped region 180 is in contact with the buried insulating layer 102. The fourth doped regions 180 are electrically connected to the second doped regions 130 through the contacts 166, the conductive wires 164 and the contacts 162 of the second metal interconnection 160.

Referring to FIG. 1B, the fifth doped regions 190 are located at the first side S1 of the body part BP. The fifth doped regions 190 are formed outside of the extension parts EP. That is, the fifth doped regions 190 are disposed at outer sides of the outer extension parts EPo. Referring to FIG. 2B, the fifth doped regions 190 are formed in the semiconductive layer 103, and are laterally separated from the fourth doped regions 180 by the semi conductive layer 103. The fifth doped region 190 are laterally and physically connected to the second doped region 130, and can be electrically connected to the fourth doped regions 180 through the contacts 162 arranged on the second doped region 130, the conductive wires 164 and the contacts 166. Therefore, there may be no contact provided directly above the fifth doped regions 190.

Referring to FIG. 2A to FIG. 2D, in some examples, metal silicide layers 192 are respectively formed on the gate conductive layer 106, the first doped regions 120, the second doped regions 130, the third doped regions 170, the fourth doped regions 180 and the fifth doped regions 190. The metal silicide layers 192 are in contact with the contacts 152, 162, 166 respectively to reduce the sheet resistance of the contacts 152, 162, 166. The metal silicide layers 192 may include titanium silicide ($TiSi_2$), cobalt silicide, nickel silicide, platinum silicide or a combination thereof.

In some embodiments, the method of fabricating the electrostatic discharge protection device 99A includes the following steps.

Referring to FIG. 1B and FIG. 2A, a substrate 100 is provided. The substrate 100 includes a semiconductor-on-insulator substrate. The semiconductor-on-insulator substrate includes a semiconductor substrate 101, a buried insulating layer 102 and a semiconductive layer 103. The semiconductor substrate 101 may be a silicon substrate. The buried insulating layer 102 is located between the semiconductor substrate 101 and the semi conductive layer 103. The buried insulating layer 102 may be a silicon oxide layer. The semiconductive layer 103 is located on the buried insulating layer 102. The semiconductive layer 103 may be a silicon layer. The semiconductive layer 103 may have dopants of the second conductivity type. The dopant of the second conductivity type may be a P-type dopant. The P-type dopant includes boron or boron trifluoride.

Referring to FIG. 2A, an isolation structure 105 is formed in the substrate 100. The isolation structure 105 may be a shallow trench isolation structure. The material of the isolation structure 105 includes silicon oxide, silicon nitride or a combination thereof. The isolation structure 105 may have a single-layer or multi-layer structure. Thereafter, a gate structure 110 is formed on the substrate 100. The gate structure 110 includes a gate dielectric layer 104 and a gate conductive layer 106. The gate dielectric layer 104 is interposed between the gate conductive layer 106 and the semiconductive layer 103. The material of the gate dielectric layer 104 includes silicon oxide. The gate conductive layer 106 is located on the gate dielectric layer 104. The material of the gate conductive layer 106 includes doped polysilicon, metal or metal polycide. In some embodiments, the gate structure 110 may further include spacers 108. The spacers 108 are located on sidewalls of the gate dielectric layer 104 and the gate conductive layer 106. The spacers 108 may have a single-layer or multi-layer structure. The material of the spacers 108 includes silicon oxide, silicon nitride or a combination thereof.

Referring to FIG. 2A, in some embodiments, the gate structure 110 is formed as follows. A gate dielectric material and a gate conductive material are formed on the substrate 100, and the gate conductive material and the gate dielectric material are then patterned through processes (e.g., lithography and etching processes) to form the gate conductive layer 106 and the gate dielectric layer 104. Afterwards, a spacer material is formed on the substrate 100 and the gate conductive layer 10, and an anisotropic etching process is performed to the spacer material to form the spacers 108.

Referring to FIG. 1B, a mask layer is formed on the substrate 100, an ion implantation process is performed, and dopants of the first conductivity type are implanted in the semiconductive layer 103 of the substrate 100 to form a plurality of first doped regions 120 and a plurality of a third doped region 170. The dopant of the first conductivity type may be an N-type dopant. The N-type dopant includes phosphorus or arsenic. Referring to FIG. 2A and FIG. 2D, the first doped regions 120 and the third doped regions 170 extend from the top surface to the bottom surface of the semiconductive layer 103, and are in contact with the top surface of the buried insulating layer 102, so as to block the downward current path. The third doped regions 170 are in lateral contact with the first doped regions 120.

Referring to FIG. 2A, in some embodiments, the electrostatic discharge protection device 99A further includes a plurality of first lightly doped regions 122. The first lightly doped regions 122 are formed in the semiconductive layer 103 below the spacers 108 at two sides of each inner extension parts EPi and at the inner sides of the outer extension parts EPo, and are electrically connected to the first doped regions 120. The conductivity type of the dopants in the first lightly doped regions 122 is the same as that of the dopants in the first doped regions 120. The first lightly doped regions 122 extend from the top surface to the bottom surface of the semiconductive layer 103, but do not extend to the bottom surface of the semiconductive layer 103. In other words, the junction depths of the first lightly doped regions 122 are shallower than the junction depths of the first doped regions 120. When the electrostatic discharge protection device 99A operates, channel regions Ch1, Ch2, Ch3 and Ch4 are formed between the first lightly doped regions 122 below the inner extension parts EPi of the gate structure 110. In some embodiments, the channel regions Ch1, Ch2, Ch3 and Ch4 are channel regions of the first conductivity type.

Referring to FIG. 1B, another mask layer is formed on the substrate 100, an ion implantation process is performed, and dopants of the second conductivity type are implanted in the semiconductive layer 103 of the substrate 100 to form a plurality of second doped regions 130, a plurality of fourth doped region 180 and a plurality of fifth doped regions 190. The dopant of the second conductivity type may be a P-type dopant. The dopant of the second conductivity type includes boron or boron trifluoride. Referring to FIG. 2A to FIG. 2D, the second doped regions 130, the fourth doped regions 180, and the fifth doped regions 190 extend from the top surface to the bottom surface of the semiconductive layer 103, and are in contact with the top surface of the buried insulating layer 102. In other words, the second doped region 130, the fourth doped regions 180 and the fifth doped regions 190 block the downward current path through the buried insulating layer 102.

Referring to FIG. 2A, in some embodiments, the electrostatic discharge protection device 99A further includes a plurality of second lightly doped regions 132. The second lightly doped regions 132 are formed in the semiconductive layer 103 below the spacers 108 on the outer extension parts EPo, and are electrically connected to the second doped regions 130. The conductivity type of the dopants in the second lightly doped regions 132 is the same as that of the dopants in the second doped regions 130. The second lightly doped regions 132 extend from the top surface to the bottom surface of the semiconductive layer 103, but do not extend to the bottom surface of the semiconductive layer 103. In other words, the junction depths of the second lightly doped regions 132 are shallower than the junction depths of the second doped regions 130.

The electrostatic discharge protection device 99A may further include other lightly doped regions (not shown) respectively having the same conductivity type dopant with the corresponding third doped regions 170, the fourth doped regions 180 and the fifth doped regions 190, and are electrically connected to the corresponding third doped regions 170, the fourth doped regions 180 and the fifth doped regions 190.

Referring to FIG. 2A, in an embodiment of the present disclosure, the first lightly doped regions 122 and the first doped regions 120 at two sides of the inner extension parts EPi of the gate structure 110 are of the same conductivity type. The inner extension parts EPi of the gate structure 110, and the first lightly doped regions 122 and the first doped regions 120 at two sides thereof constitute a plurality of bipolar junction transistors 100N. Each bipolar junction transistor 100N is a metal oxide semiconductor transistor having a channel of the first conductivity type, such as an NMOS transistor. Two channels of the first conductivity type of the adjacent metal oxide semiconductor transistors 100N are in direct contact with each other and share the first doped region 120.

Referring to FIG. 2A, the semiconductive layer 103 directly below the outer extension parts EPo of the gate structure 110 is of the second conductivity type. The first lightly doped region 122 and the first doped region 120 at one side of the outer extension parts EPo of the gate structure 110 is of the first conductivity type, and the second lightly doped region 132 and the second doped region 130 at another side of the outer extension parts EPo of the gate structure 110 is of the second conductivity type. Therefore, the outer extension parts EPo of the gate structure 110, the first lightly doped regions 122, the first doped regions 120, the second lightly doped regions 132 and the second doped regions 130 constitute embedded gated diodes 100D1. Each embedded gated diode 100D1 is an embedded gated diode of the first conductivity type, for example, an embedded N-type gated diode. The embedded gated diode 100D1 and the adjacent MOS transistor 100N of the first conductivity type are connected in parallel and in direct contact with each other, and share the first doped region 120.

Referring to FIG. 2D, the fourth doped region 180 and the third doped region 170 at two sides of the body part BP of the gate structure 110, and the body part BP of the gate structure 110 constitute a gated diode 100D2, such as an embedded N-type gated diode. The adjacent gated diodes 100D2 share the fourth doped region 180, as shown in FIG. 1B.

Referring to FIG. 2A to FIG. 2D, a self-aligned metal silicidation process is performed, so that metal silicide layers 192 are respectively formed on the gate conductive layer 106, the first doped regions 120, the second doped regions 130, the third doped regions 170, the fourth doped regions 180 and the fifth doped regions 190. The self-aligned metal silicidation process includes forming a metal layer on the substrate 100. The metal layer includes titanium, cobalt, nickel, platinum or a combination thereof. Next, a thermal process such as a rapid thermal oxidation process (RTP) is performed, so that the metal layer reacts with silicon of the gate conductive layer 106, the first doped regions 120, the second doped regions 130, the third doped regions 170, the fourth doped regions 180 and the fifth doped regions 190 to form the metal silicide layers 192.

Referring to FIG. 1C and FIG. 2A, an interlayer dielectric layer 140 is formed on the substrate 100. The material of the interlayer dielectric layer 140 includes silicon oxide, silicon nitride or a combination thereof. The interlayer dielectric layer 140 may have a single-layer or multi-layer structure. A first metal interconnection 150 and a second metal interconnection 160 are then formed. The method of forming the first metal interconnection 150 and the second metal interconnection 160 may include the following steps. The contacts 152, 162, 166 are formed in the interlayer dielectric layer 140, and the conductive wires 154 and 164 are then formed on the interlayer dielectric layer 140.

In the above embodiments, a gate structure 110 (e.g., the outer extension parts EPo) is provided on the semiconductive layer 103 between the outermost first doped region 120 and the second doped region 130 to form an embedded gated diode 100D1. In other embodiments, there is no gate structure 110 provided on the semiconductive layer 103 between the outermost first doped region 120 and the second doped region 130; that is, the above-mentioned outer extension part EPo is omitted. Accordingly, an electrostatic discharge protection device 99B having at least one embedded non-gated diode 200D1 is formed, as shown in FIG. 3A, FIG. 3B, FIG. 4A and FIG. 4B.

Figure 3A:
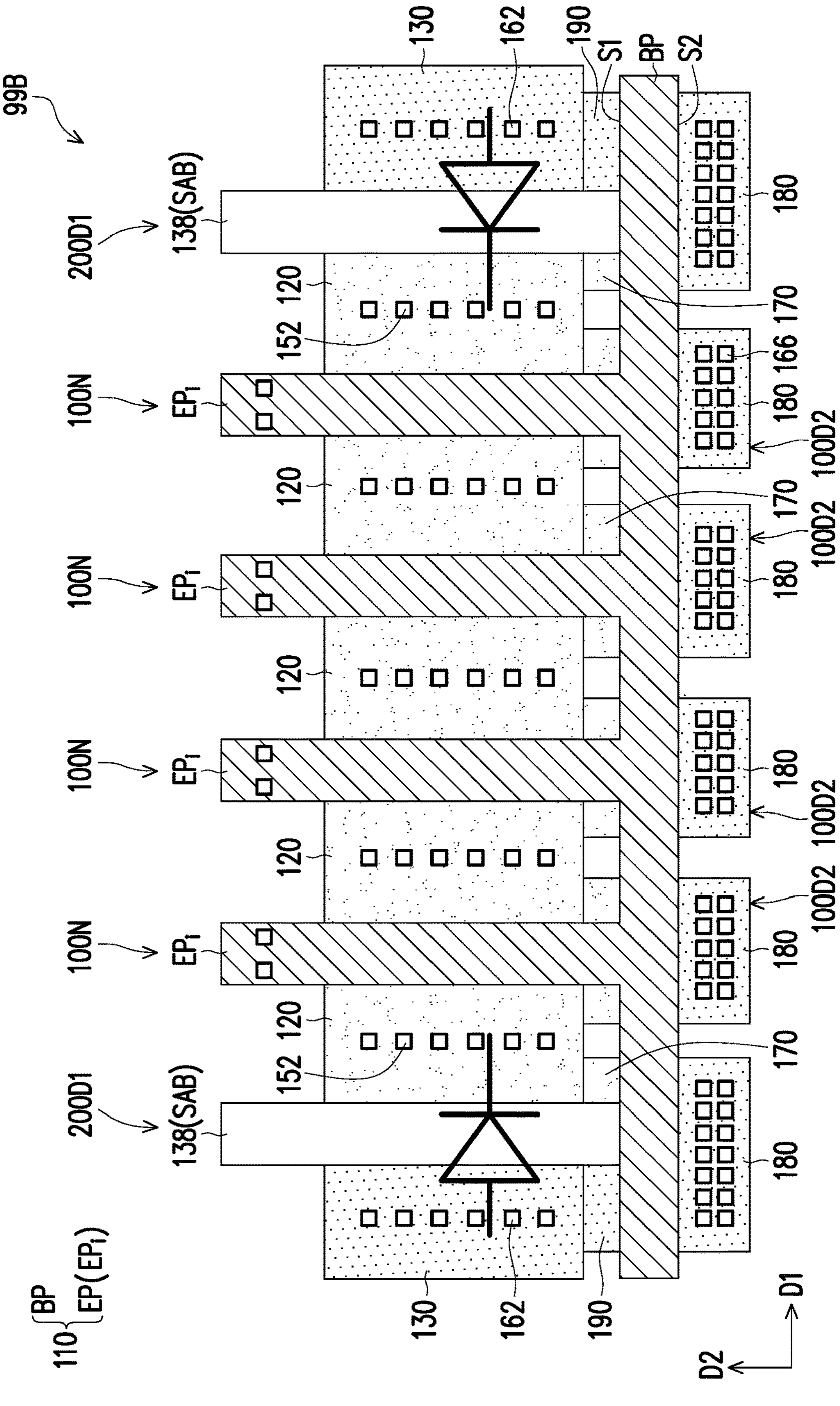
FIG. 3A is a top view of another electrostatic discharge protection device according to an embodiment of the present disclosure.
Figure 3B:
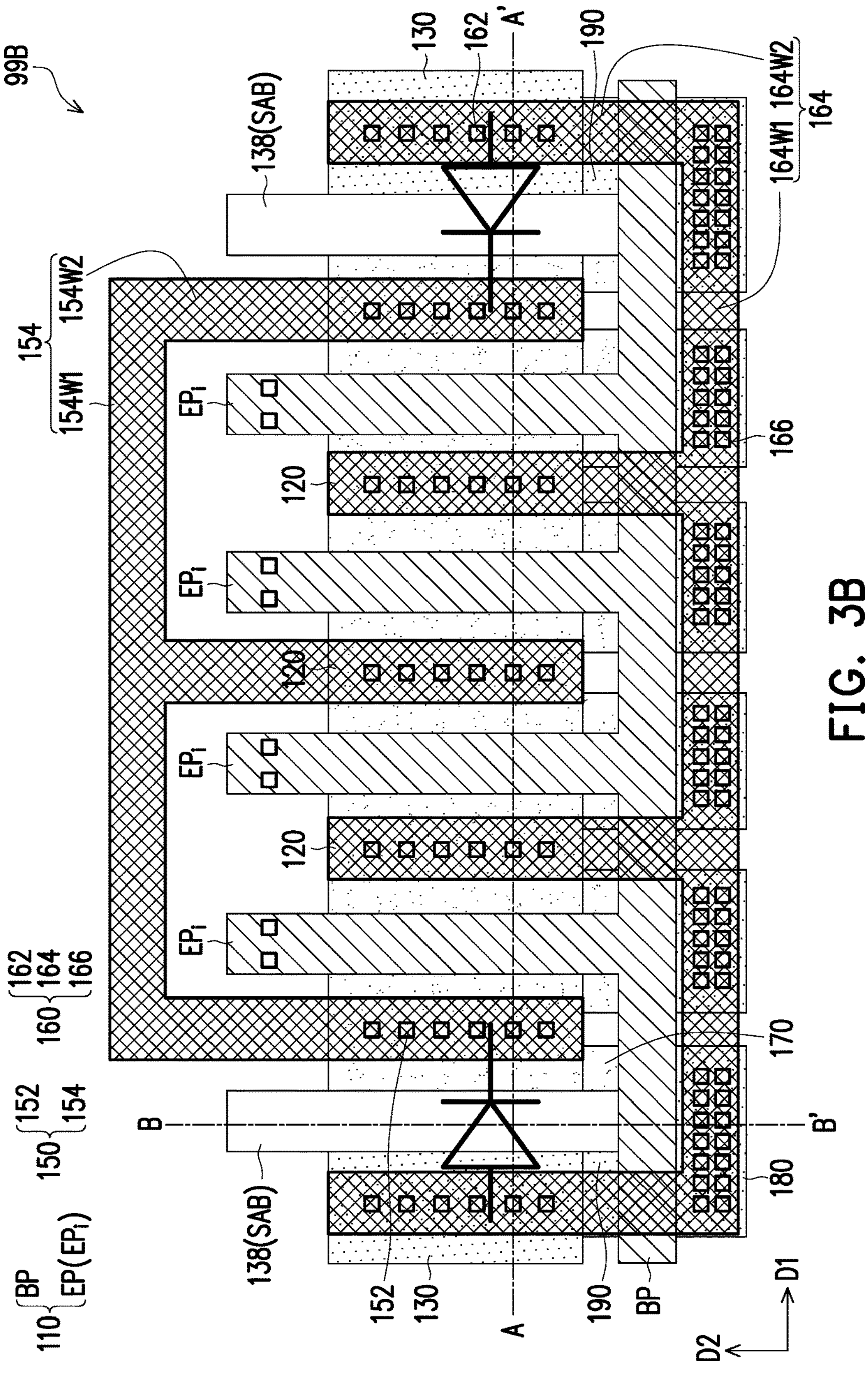
FIG. 3B is a top view of another electrostatic discharge protection device having metal interconnections according to an embodiment of the present disclosure.
Figure 4A:
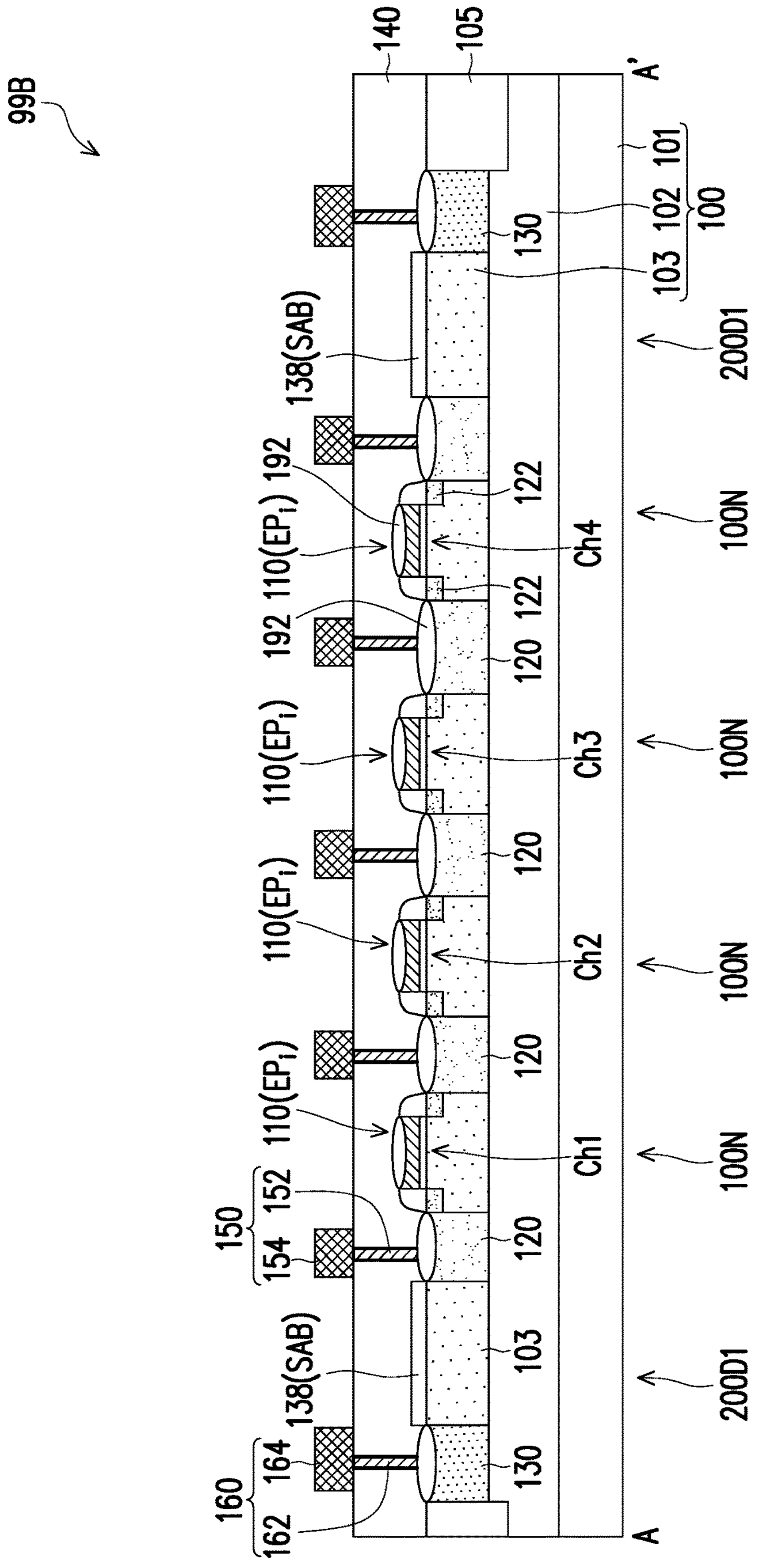
FIG. 4A and FIG. 4B are schematic cross-sectional views taken along lines A-A' and B-B' in FIG. 3B, respectively.
Figure 4B:
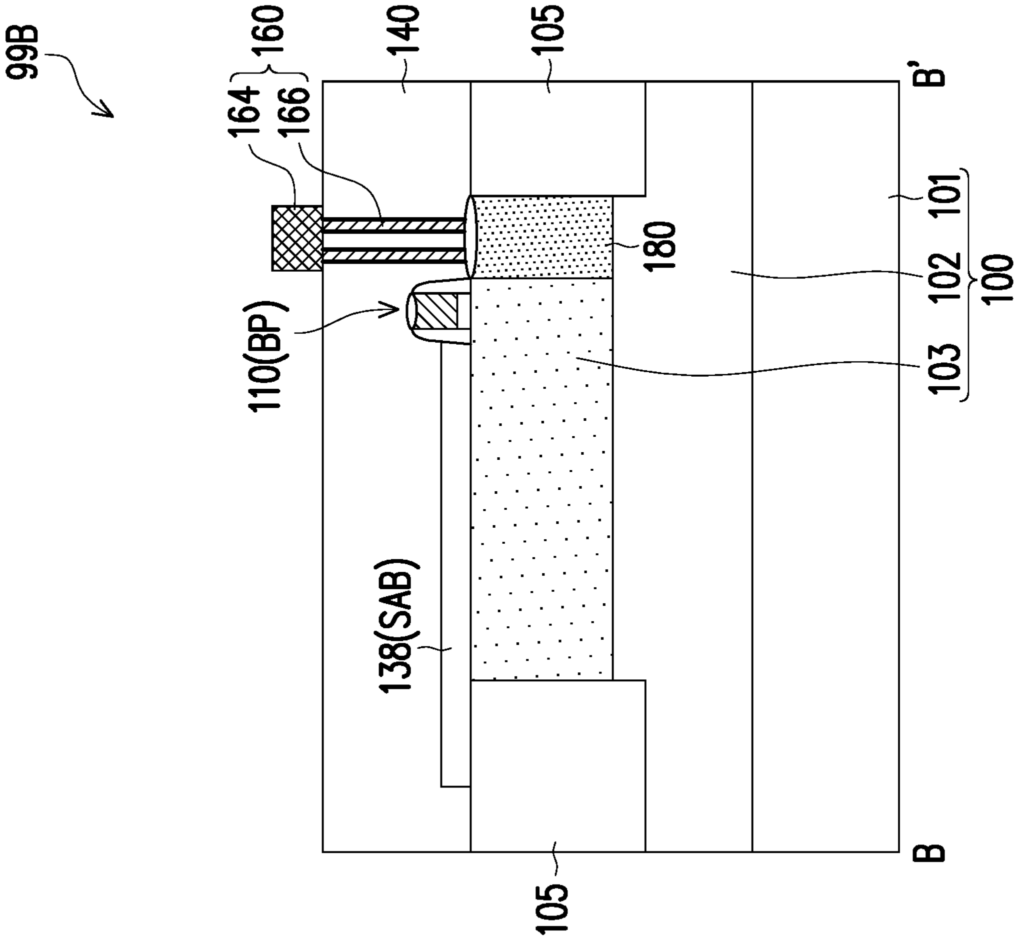

FIG. 3A is a top view of another electrostatic discharge protection device according to an embodiment of the present disclosure. FIG. 3B is a top view of another electrostatic discharge protection device having metal interconnections according to an embodiment of the present disclosure. FIG. 4A and FIG. 4B are schematic cross-sectional views taken along lines A-A' and B-B' in FIG. 3B, respectively.

Referring to FIG. 3A and FIG. 4A, the electrostatic discharge protection device 99B includes a plurality of bipolar junction transistors 100N, and a plurality of embedded non-gated diodes 200D1 connected to the bipolar junction transistors 100N. An insulating structure 138 directly covers and contacts the semiconductive layer 103 between the outermost first doped region 120 and the second doped region 130 of the electrostatic discharge protection device 99B. One end of the insulating structure 138 is connected to the body part BP of the gate structure 110, as shown in FIG. 3A. The material of the insulating structure 138 includes silicon oxide. The insulating structure 138 may have a single-layer or multi-layer structure. In some embodiments, the insulating structure 138 covers the semiconductive layer 103 to prevent the metal silicide layer 192 from forming on the semiconductive layer 103, while metal silicide layers 192 are formed on the gate conductive layer 106, the first doped regions 120, the second doped regions 130, the third doped regions 170, the fourth doped regions 180 and the fifth doped regions 190, as shown in FIG. 4A and FIG. 4B. The insulating structure 138 is formed on the substrate 100 before performing the silicidation process. The insulating structure 138 may be referred to as a "blocking dielectric layer" or a "silicide blocking (SAB) layer". The method for forming the insulating structure 138 includes forming an insulating material on the substrate 100, and then performing lithography and etching processes to pattern the insulating material, so that an insulating structure 138 is formed on the semiconductive layer 103 between the outermost first doped region 120 and the second doped region 130. The insulating structure 138, the first lightly doped region 122, the first doped region 120, the second lightly doped region 132 and the second doped region 130 constitute an embedded non-gated diode 200D1.

Figure 5A:
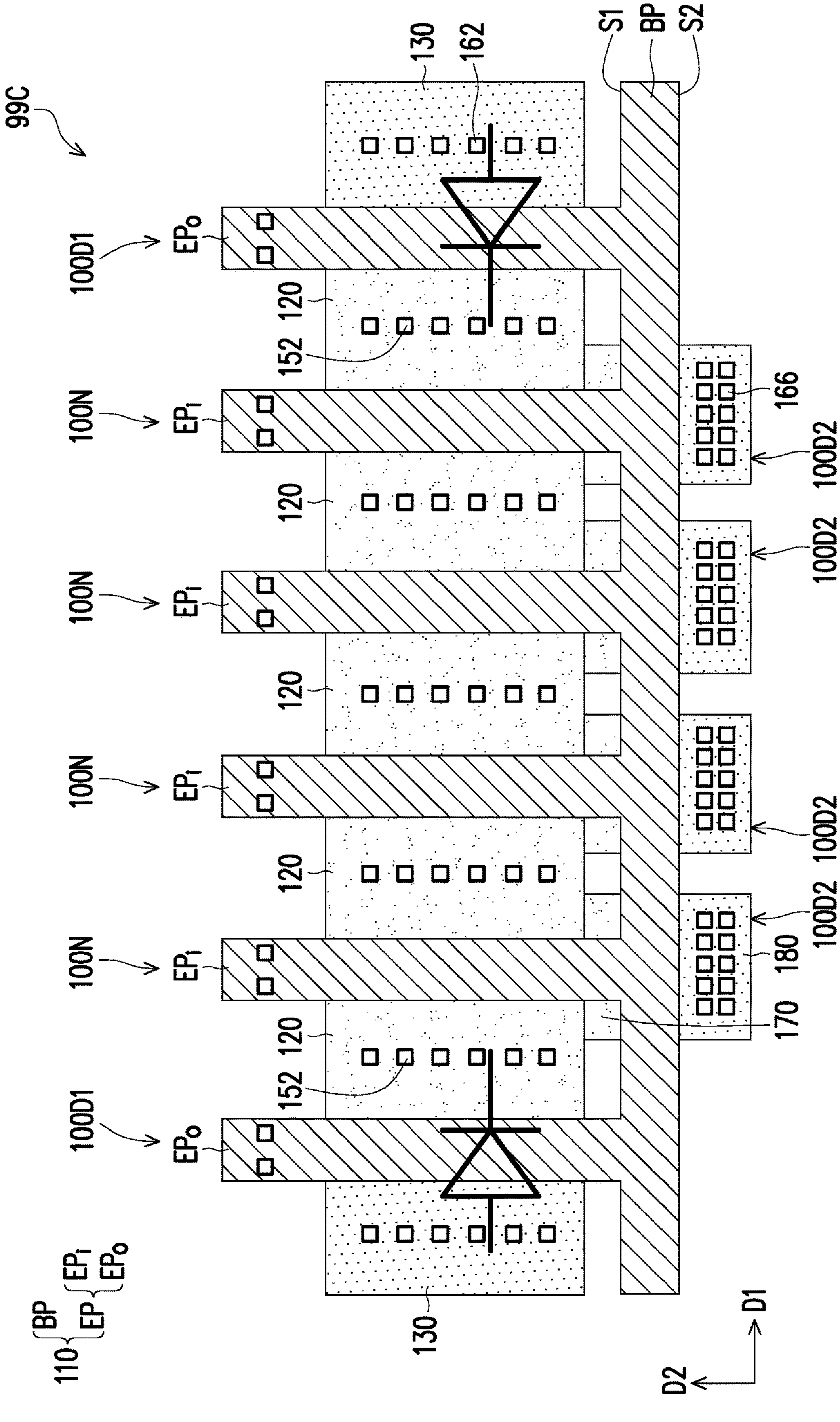
FIG. 5A is a top view of another electrostatic discharge protection device according to an embodiment of the present disclosure.
Figure 5B:
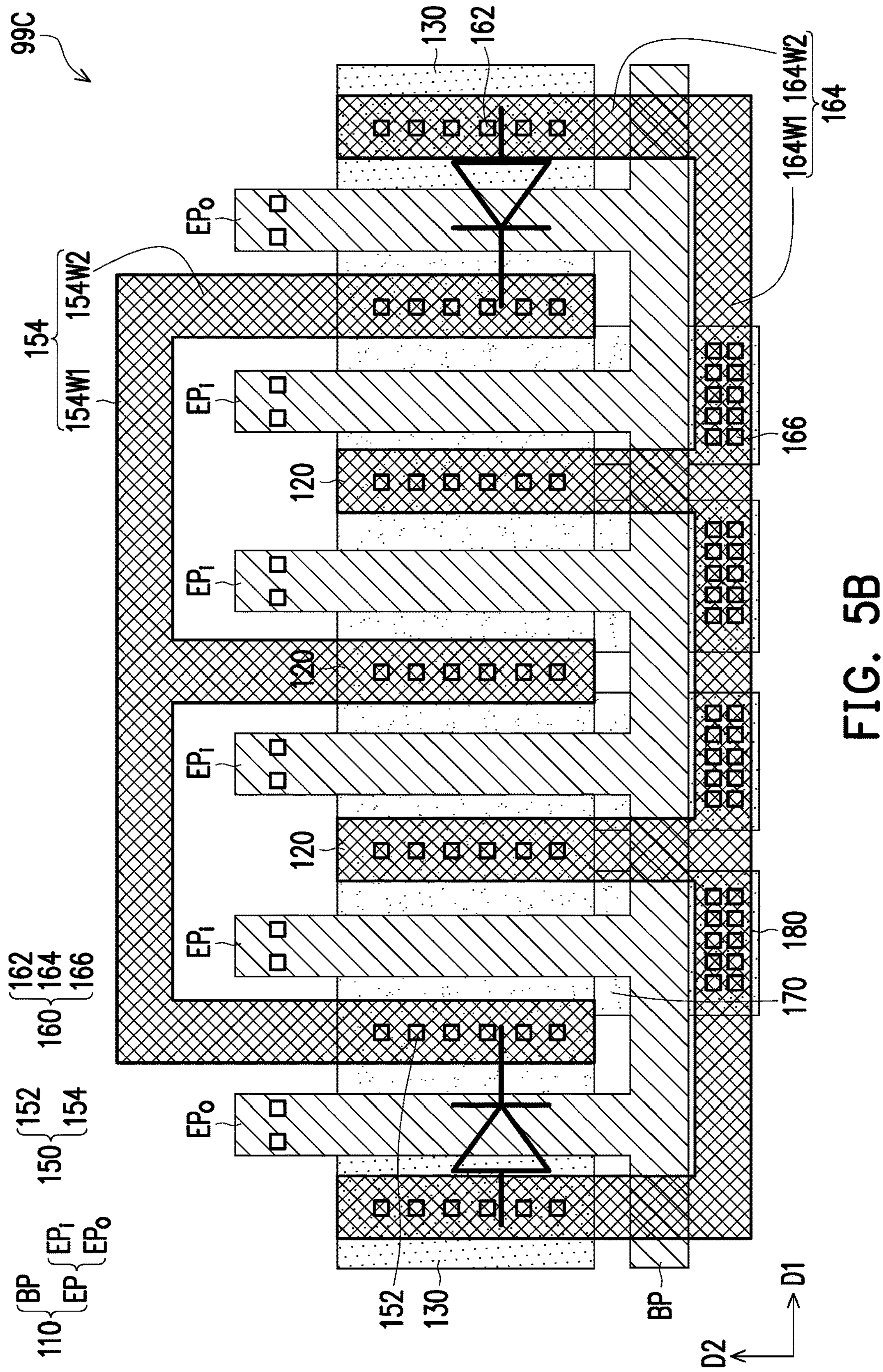
FIG. 5B is a top view of another electrostatic discharge protection device having metal interconnections according to an embodiment of the present disclosure.

In the above embodiments, the fifth doped regions 190, part of the third doped regions 170, and part of the fourth doped regions 180 can be omitted from in FIG. 1B and FIG. 1C, and an electrostatic discharge protection device 99C is accordingly formed, as shown in FIG. 5A and FIG. 5B. FIG. 5A is a top view of another electrostatic discharge protection device according to an embodiment of the present disclosure. FIG. 5B is a top view of another electrostatic discharge protection device having metal interconnections according to an embodiment of the present disclosure.

Referring to FIG. 5A and FIG. 5B, the electrostatic discharge protection device 99C includes a plurality of bipolar junction transistors 100N, and a plurality of embedded gated diodes 100D1 connected to the bipolar junction transistors 100N. The electrostatic discharge protection device 99C is similar to the above-mentioned electrostatic discharge protection device 99A, but the third doped regions 170, the fourth doped regions 180 and the fifth doped regions 190 at ends of the body part BP and at two sides of the outer extension part EPo of the gate structure 110 are omitted.

Figure 6A:
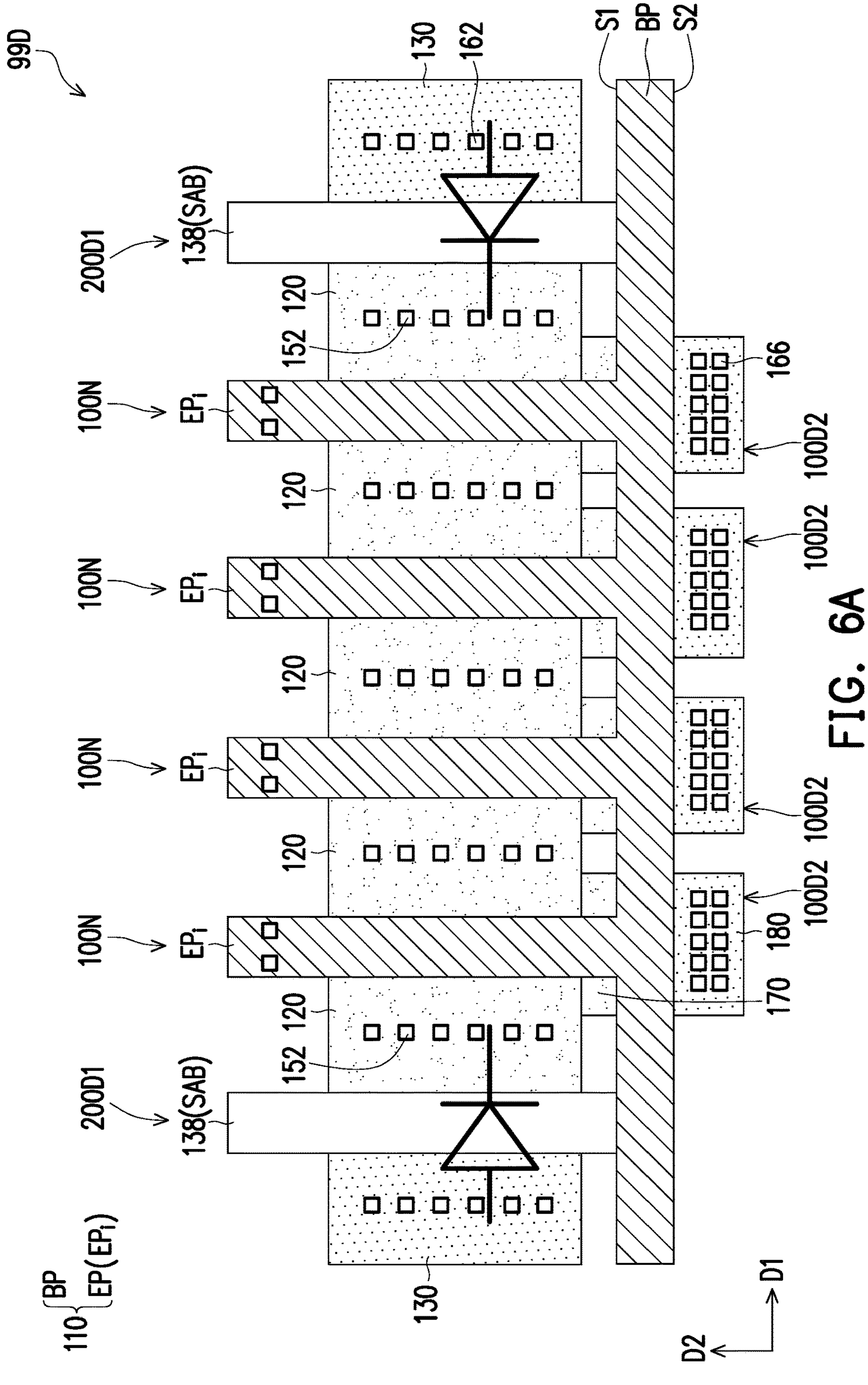
FIG. 6A is a top view of another electrostatic discharge protection device according to an embodiment of the present disclosure.
Figure 6B:
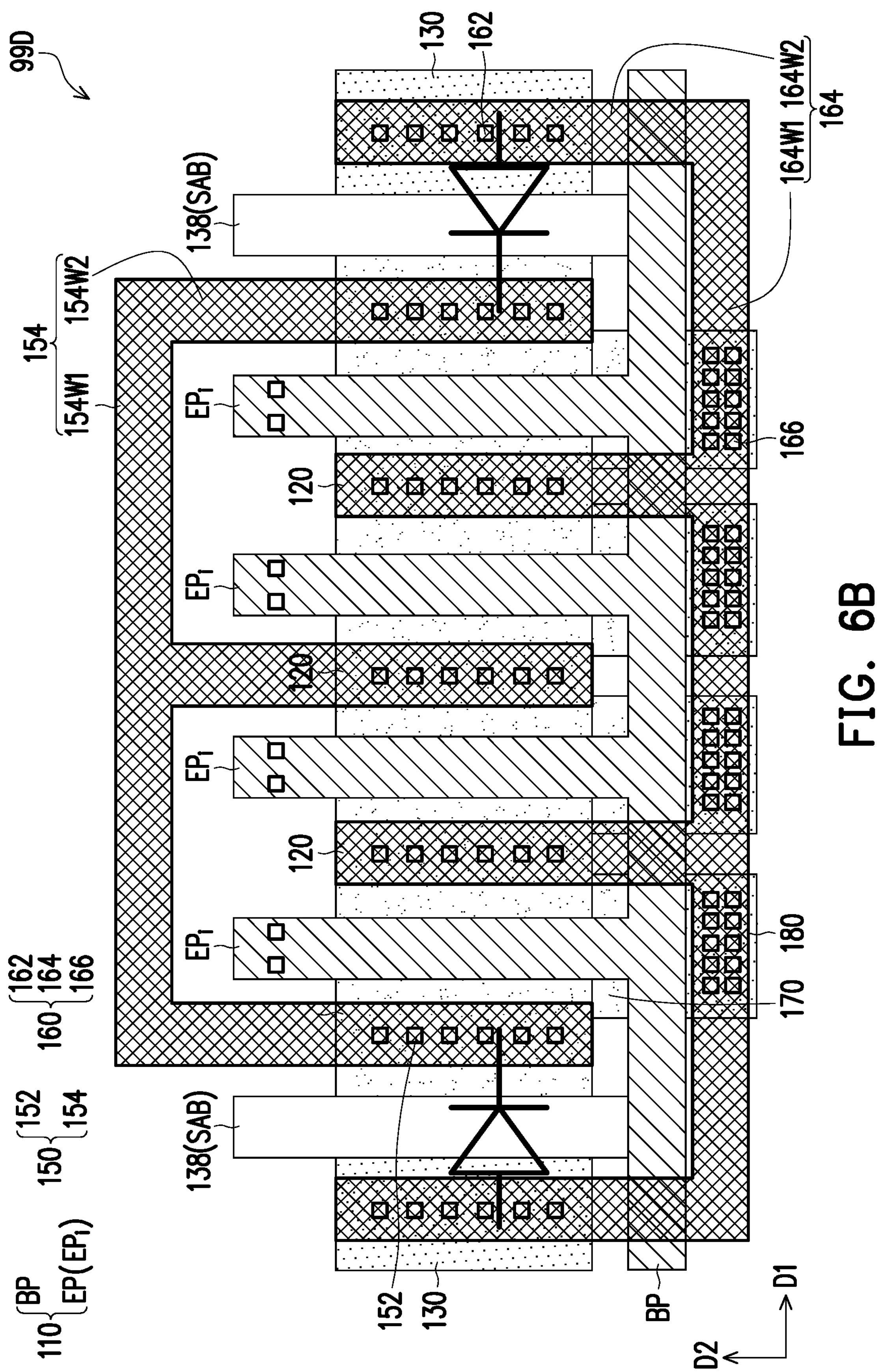
FIG. 6B is a top view of another electrostatic discharge protection device having metal interconnections according to an embodiment of the present disclosure.

Similarly, in the above embodiments, the fifth doped regions 190, part of the third doped regions 170, and part of the fourth doped regions 180 may be omitted from FIG. 3A and FIG. 3B can be omitted, and an electrostatic discharge protection device 99D is accordingly formed, as shown in FIG. 6A and FIG. 6B. FIG. 6A is a top view of another electrostatic discharge protection device according to an embodiment of the present disclosure. FIG. 6B is a top view of another electrostatic discharge protection device having metal interconnections according to an embodiment of the present disclosure.

Referring to FIG. 6A and FIG. 6B, the electrostatic discharge protection device 99D includes a plurality of bipolar junction transistors 100N, and a plurality of embedded non-gated diode 200D1 connected to the bipolar junction transistors 100N. The electrostatic discharge protection device 99D is similar to the above-mentioned electrostatic discharge protection device 99B, but the third doped regions 170, the fourth doped regions 180 and the fifth doped regions 190 at ends of the body part BP and at two sides of the insulating structure 138 are omitted.

In view of the above, the embodiment of the present disclosure provides an electrostatic discharge protection device having at least one diode, so as to enhance the negative human body discharge mode and therefore withstand the high voltage electrostatic discharge test. In some embodiments, the negative human body model (−HBM) can be boosted from −2.2 kV to −7.4 kV. Moreover, in the embodiment of the present disclosure, since such diode of the electrostatic discharge protection device is embedded and in direct contact with the bipolar junction transistor, or such diode and the bipolar junction transistor share the doped region, so the chip area can be saved. The layout size of the electrostatic discharge protection device with embedded diodes of the present disclosure is smaller than the layout size of the conventional case of disposing diodes aside an electrostatic discharge protection device, and the chip area can be saved up to 40%. In addition, the manufacturing method of the electrostatic discharge protection device according to the embodiment of the present disclosure can be integrated with the existing manufacturing process.

Although the disclosure has been disclosed as above with embodiments, they are not intended to limit the disclosure. People with ordinary skills in the art can make some changes and modifications without departing from the spirit of the disclosure, so the scope of the disclosure shall be defined by the following claims.

What is claimed is:

1. An electrostatic discharge protection device, comprising:

a gate structure disposed on a substrate, wherein the gate structure comprises a body part and a plurality of extension parts, the body part is connected to the plurality of extension parts, and an extension direction of the body part is different from an extension direction of the plurality of extension parts;

a plurality of first doped regions disposed in the substrate between the plurality of extension parts;

a plurality of second doped regions disposed in the substrate at two outer sides of the plurality of extension parts, wherein the plurality of first doped regions and the plurality of second doped regions have different conductivity types;

a plurality of third doped regions disposed in the substrate at a first side of the body part of the gate structure and between the extension parts of the gate structure;

a plurality of fourth doped regions disposed in the substrate at a second side of the body part of the gate structure; and a plurality of fifth doped regions disposed in the substrate at the first side of the body part of the gate structure and outside of and the extension parts of the gate structure, wherein the third doped regions and the first doped regions have the same conductivity type, and the fifth doped regions, the fourth doped regions and the second doped regions have the same conductivity type.

2. The electrostatic discharge protection device of claim 1, further comprising:

a plurality of insulating structures disposed on the substrate between outermost extension parts of the extension parts and the second doped regions.

3. The electrostatic discharge protection device of claim 2, wherein some of the plurality of the first doped regions are further disposed between the outermost extension parts and the insulating structures.

4. The electrostatic discharge protection device of claim 2, wherein the body part is connected to the insulating structures.

5. The electrostatic discharge protection device of claim 1, wherein the substrate comprises a semiconductor-on-insulator substrate, and the semiconductor-on-insulator comprises:

a semiconductor substrate;

a semiconductive layer disposed over the semiconductor substrate; and a buried insulating layer located between the semiconductor substrate and the semiconductive layer, wherein the first doped regions and the second doped regions are located in the semiconductive layer of the semiconductor-on-insulator substrate.

6. The electrostatic discharge protection device of claim 1, wherein the third doped regions are laterally and physically connected to the first doped regions.

7. The electrostatic discharge protection device of claim 1, wherein the fifth doped regions are laterally and physically connected to the second doped regions, and laterally separated from the fourth doped regions.

8. The electrostatic discharge protection device of claim 7, further comprising a first metal interconnection electrically connected to first portions of the first doped regions.

9. The electrostatic discharge protection device of claim 8, further comprising a second metal interconnection electrically connected to the fourth doped regions and the second doped regions.

10. The electrostatic discharge protection device of claim 9, wherein the second metal interconnection is further electrically connected to second portions of the first doped regions.

11. The electrostatic discharge protection device of claim 10, wherein a first wiring part of the first metal interconnection and a first wiring part of the second metal interconnection are disposed in parallel to each other, and a plurality of second wiring parts of the first metal interconnection and a plurality of second wiring parts of the second metal interconnection are disposed in parallel to each other and arranged alternately.

12. The electrostatic discharge protection device of claim 11, wherein the first metal interconnection, the second metal interconnection and the plurality of gate structures are respectively comb-shaped or finger-shaped.

13. A method of fabricating an electrostatic discharge protection device, comprising:

forming a gate structure on the substrate, wherein the gate structure comprises a body part and a plurality of extension parts, an extending direction of the body part is different from an extension direction of the plurality of extension parts, and the body part is connected to the plurality of extension parts;

forming a plurality of first doped regions in the substrate between the plurality of extension parts;

forming a plurality of second doped regions in the substrate at two outer sides of the plurality of extension parts, wherein the plurality of first doped regions and the plurality of second doped regions have different conductivity types;

forming a plurality of third doped regions in the substrate at a first side of the body part of the gate structure and between the extension parts of the gate structure;

forming a plurality of fourth doped regions in the substrate at a second side of the body part of the gate structure; and forming a plurality of fifth doped regions in the substrate at the first side of the body part of the gate structure and outside of the extension parts of the gate structure, wherein the third doped regions and the first doped regions have the same conductivity type, and the fifth doped regions, the fourth doped regions and the second doped regions have the same conductivity type.

14. The method of claim 13, further comprising:

forming a plurality of insulating structures over the substrate between outermost extension parts of the extension parts and the second doped regions; and forming the first doped regions between the outermost extension parts and the insulating structures.

15. The method of claim 14, further comprising:

performing a self-aligned silicidation process by using the insulating structures as blocking layers, so as to form a plurality of metal silicide layers respectively on a gate conductive layer of the gate structure, the first doped regions, and the second doped regions.

16. The method of claim 13, wherein the third doped regions are at two sides of the extension parts, and are laterally and physically connected to the first doped regions, and laterally separated from the fourth doped regions, and the second doped regions are laterally separated from the first doped regions.

17. The method of claim 16, further comprising:

forming an interconnection structure on the substrate, wherein the interconnection structure comprises:

a first metal interconnection electrically connected to first portions of the first doped regions between the extension parts; and a second metal interconnection electrically connected to the second doped regions and the fourth doped regions, and second portions of the first doped regions between and the extension parts.

* * * * *